United States Patent
Coteus et al.

(10) Patent No.: US 9,281,302 B2
(45) Date of Patent: Mar. 8, 2016

(54) IMPLEMENTING INVERTED MASTER-SLAVE 3D SEMICONDUCTOR STACK

(71) Applicant: International Business Machines Corporation, Armonk, NY (US)

(72) Inventors: Paul W. Coteus, Yorktown, NY (US); Shawn A. Hall, Pleasantville, NY (US); Todd E. Takken, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/184,868

(22) Filed: Feb. 20, 2014

(65) Prior Publication Data

US 2015/0236001 A1    Aug. 20, 2015

(51) Int. Cl.
*H01L 25/18* (2006.01)
*H01L 23/367* (2006.01)
*H01L 23/498* (2006.01)
*H01L 25/00* (2006.01)
*H01L 25/065* (2006.01)
*H01L 23/00* (2006.01)
*H01L 27/108* (2006.01)

(52) U.S. Cl.
CPC .............. *H01L 25/18* (2013.01); *H01L 23/367* (2013.01); *H01L 23/49827* (2013.01); *H01L 24/83* (2013.01); *H01L 25/0657* (2013.01); *H01L 25/50* (2013.01); *H01L 27/10844* (2013.01); *H01L 2225/06541* (2013.01); *H01L 2225/06589* (2013.01)

(58) Field of Classification Search
CPC . H01L 25/18; H01L 23/367; H01L 23/49827; H01L 25/50; H01L 25/0657; H01L 24/83; H01L 27/10844
See application file for complete search history.

(56) References Cited

U.S. PATENT DOCUMENTS

| | | | |
|---|---|---|---|
| 4,630,172 | A | 12/1986 | Stenerson et al. |
| 5,434,745 | A | 7/1995 | Shokrgozar et al. |
| 6,919,626 | B2 | 7/2005 | Burns |
| 7,700,409 | B2 | 4/2010 | Jensen et al. |
| 8,062,929 | B2 | 11/2011 | Do et al. |
| 8,343,804 | B2 | 1/2013 | Coteus et al. |
| 8,516,409 | B2 | 8/2013 | Coteus et al. |

(Continued)

FOREIGN PATENT DOCUMENTS

JP    03-280496    12/1991

OTHER PUBLICATIONS

Appendix P—List of IBM Patents or Patent Applications Treated as Related—Jun. 13, 2015.

*Primary Examiner* — Long Pham
(74) *Attorney, Agent, or Firm* — Joan Pennington

(57) ABSTRACT

A method and apparatus are provided for implementing an enhanced three dimensional (3D) semiconductor stack. A chip carrier has an aperture of a first length and first width. A first chip has at least one of a second length greater than the first length or a second width greater than the first width; a second chip attached to the first chip, the second chip having at least one of a third length less than the first length or a third width less than the first width; the first chip attached to the chip carrier by connections in an overlap region defined by at least one of the first and second lengths or the first and second widths; the second chip extending into the aperture; and a heat spreader attached to the chip carrier and in thermal contact with the first chip for dissipating heat from both the first chip and second chip.

9 Claims, 16 Drawing Sheets

(56) References Cited

U.S. PATENT DOCUMENTS

| | | |
|---|---|---|
| 2009/0166886 A1 | 7/2009 | Kim et al. |
| 2012/0187578 A1* | 7/2012 | Li .................................. 257/778 |
| 2013/0102111 A1 | 4/2013 | Kim |
| 2013/0119527 A1 | 5/2013 | Luo et al. |
| 2015/0091131 A1* | 4/2015 | Lamorey et al. ............... 257/532 |

* cited by examiner

IMPLEMENTING INVERTED MASTER-SLAVE 3D SEMICONDUCTOR STACK

STATEMENT REGARDING FEDERALLY SPONSORED RESEARCH OR DEVELOPMENT

This invention was made with Government support under Contract No. B601996 awarded by the United States Department of Energy. The Government has certain rights in this invention.

FIELD OF THE INVENTION

The present invention relates generally to the data-processing field, and more particularly, to a method and apparatus for implementing an enhanced, three-dimensional (3D) semiconductor stack.

DESCRIPTION OF THE RELATED ART

Three-dimensional (3D) semiconductor stacking including 3D semiconductor memory stacking is an emerging technology. A 3D semiconductor memory stack advantageously can include a processor die, also known as the logic die or master die in a stack with a slave die, such as a slave DRAM stack.

Micron Technology has recently proposed a hybrid memory cube (HMC) in which four to eight dynamic random-access memory (DRAM) die are stacked one above the other using through-silicon-via (TSV) technology. This space- and energy-efficient group of DRAMs is then connected to a controller device, forming either a five-chip or nine-chip stack. A Hybrid Memory Cube Consortium (HMCC) is backed by several major technology companies.

The HMC is a very-high-bandwidth device, and promises to be a compelling technology, although it is a low-memory-capacity replacement for a hub-chip memory, Dual Inline Memory Module (DIMM) with a controlled module, for example IBM's SuperNova DIMM.

A High-Bandwidth DRAM (HBM) is a similar stack of DRAMs being developed at JEDEC, an independent semiconductor engineering trade organization and standardization body. Although high bandwidth, the HBM is also a low-memory-capacity replacement for a buffered DIMM, or DIMM with address, data, and clock redrive.

Both the HMC and the HBM are expected to be placed adjacent to a processor on a substrate having the capacity for high-density wiring. Both approaches to 3D stacking of memory require a high-wiring-density substrate between the data storage DRAM and the data processing, to carry the many signals expected between the processor and memory stack.

U.S. Pat. No. 8,343,804, issued Jan. 1, 2013 to Paul W. Coteus et al. and assigned to the present assignee, discloses a method and structure for implementing multiple different types of dies for memory stacking. In FIGS. 1A, and 1B, a master-slave structure comprises a printed circuit board (PCB), a master die, and a plurality of slave dies. For example, in the illustrated prior-art master-slave, only the bottom die, labeled "master" in the stacked package, communicates to the outside of the package, thereby to save standby power by allowing the shutting down of circuitry in other dies that are not required to operate. FIG. 1B illustrates the bottom master die, which includes a plurality of arrays and a periphery segment centrally located between the arrays. Multiple through-silicon-vias (TSVs) are placed within the periphery segment.

U.S. Pat. No. 8,343,804, issued Aug. 20, 2013 to Paul W. Coteus et al. and assigned to the present assignee, discloses a method and circuit for implementing stacking to distribute a logical function over multiple dies in through-silicon-via stacked semiconductor devices. Each die in the die stack includes predefined functional logic for implementing a respective predefined function. The respective predefined function is executed in each respective die and a respective functional result is provided to an adjacent die in the die stack. Each die in the die stack includes logic for providing die identification. An operational die signature is formed by combining a plurality of selected signals on each die. A die signature is coupled to an adjacent die using TSV interconnections where it is combined with that die signature.

A need exists for an efficient and effective method and apparatus for implementing an enhanced three dimensional (3D) semiconductor stack. It is desirable that a master die be connected directly to a chip-carrier substrate that provides power and carries interface signals. It is desirable to provide such a 3D semiconductor stack structure that preserves a simple stacked DRAM without needing to pass power connections, signal connections, or heat from an associated master die through the DRAM stack, or to impose area or power limitations on the master die.

SUMMARY OF THE INVENTION

A principal aspect of the present invention is to provide a method and apparatus for implementing an enhanced three dimensional (3D) semiconductor stack. Other important aspects of the present invention are to provide such method and apparatus substantially without negative effects, and that overcome many of the disadvantages of prior-art arrangements.

In brief, a method and apparatus are provided for implementing an enhanced, three-dimensional (3D) semiconductor stack. A chip carrier has an aperture of a first length and first width. A first chip has at least one of a second length greater than the first length or a second width greater than the first width; a second chip attached to the first chip, the second chip having at least one of a third length less than the first length or a third width less than the first width; the first chip attached to the chip carrier by connections in an overlap region defined by at least one of the first and second lengths or the first and second widths; the second chip extending into the aperture; and a heat spreader attached to the chip carrier and in thermal contact with the first chip for dissipating heat from both the first chip and second chip.

In accordance with features of the invention, the first chip includes a master die of an inverted master-slave 3D semiconductor stack. A processor or master die is connected directly to the chip carrier substrate that provides power and carries interface signals to a slave DRAM stack.

In accordance with features of the invention, the master die is placed on a wiring substrate of the chip carrier, which provides the power and all signal connections.

In accordance with features of the invention, the second chip extending through a hole in the chip carrier includes a DRAM stack that is attached directly to the master die. A thermal path exists between the master die and DRAM stack, and the DRAM stack is effectively cooled through the master die.

In accordance with features of the invention, the chip carrier aperture optionally includes a blind hole with the DRAM stack attached directly to the master die before assembly with the chip carrier. The DRAM stack is set in the blind hole cavity in the chip carrier which protects it. This also allows the lower wiring layers of the chip carrier to carry signals to an area array of contacts covering substantially the entire bottom surface thereof.

In accordance with features of the invention, the 3D semiconductor stack includes the master die, which is oversized on all four sides, thereby eliminating the need for through-silicon-vias.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, and structures are provided for implementing enhanced three dimensional (3D) semiconductor stacks.

Figure 1:
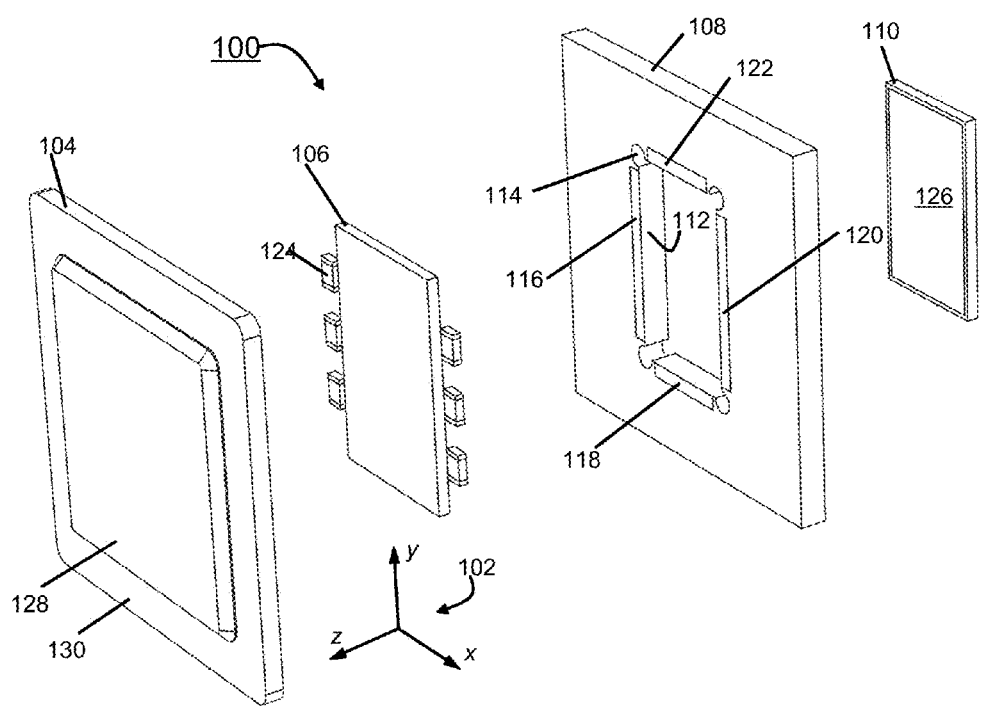
FIG. 1 is an exploded perspective view not to scale of example structures for implementing an enhanced three dimensional (3D) semiconductor stack in accordance with preferred embodiments.

Having reference now to the drawings, FIG. 1 is an exploded perspective view not to scale of example structures for implementing an enhanced three dimensional (3D) semiconductor stack generally designated by the reference character 100 in accordance with preferred embodiments. As shown, an imaginary Cartesian coordinate system 102 defines x, y, and z directions.

The 3D semiconductor stack 100 includes a lid or heat spreader 104, a processor die 106 that is also called a logic die or a master die, a chip carrier or substrate 108 having a through hole 112, and a DRAM stack 110. Chip carrier 108, which provides all power and signal connections, may be a conventional, low-cost, thin-core or coreless organic substrate with additive wiring layers, a known technology, such as practiced by Kyocera.

Through hole 112 in chip carrier 108 is slightly larger in the x and y directions than DRAM stack 110, so that DRAM stack 110 may nest in through-hole 112. Through-hole 112 optionally includes one or more corner reliefs 114 to minimize stress concentration.

Master die 106 is not thinned in the z direction, thereby eliminating the cost of a thinning process. In the x and y directions, master die 106 is provided intentionally larger than the through hole 112, so that the periphery of master die 106 may engage arrays 116, 118, 120, and 122 of connection elements that are fabricated on the positive-z-facing surface of chip carrier substrate 108, around the edges of through-hole 112. The positive-z-facing surface of chip carrier 108 comprises a plurality of arrays of connection elements around the periphery of through-hole 112, such as connection arrays 116, 118, 120, and 122, to which master die 106 will be attached.

Decoupling capacitors 124 will also be attached to chip carrier 108, using pads (not shown). The positive-z-facing surface of DRAM stack 110 comprises an array of connection elements 126 that is used to attach DRAM stack 110 to the negative-z-facing surface of master die 106.

Referring to FIGS. 2A, 2B, 2C, and 2D, there is shown an example assembly sequence for implementing the example enhanced three dimensional (3D) semiconductor stack 100 of FIG. 1 in accordance with preferred embodiments.

Figure 2A:
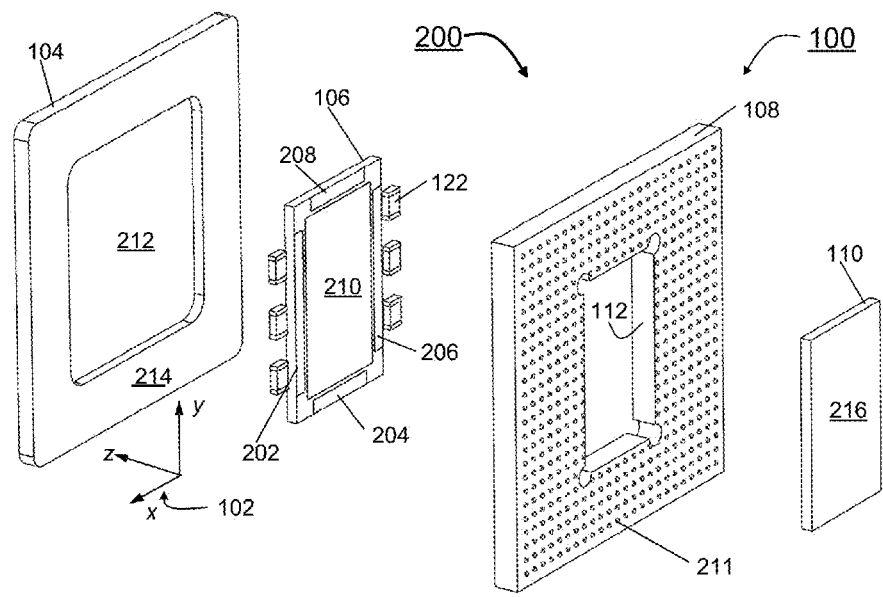
FIGS. 2A, 2B, 2C, and 2D show an example assembly sequence for implementing the example enhanced three dimensional (3D) semiconductor stack of FIG. 1 in accordance with preferred embodiments.

Referring now to FIG. 2A, the 3D semiconductor stack 100 is shown in a different view illustrating additional features generally designated by the reference character 200. As shown in FIG. 2A, a plurality of arrays 202, 204, 206, and 208 of connection elements are fabricated on the periphery of negative-z-facing surface of master die 106, which includes a central area 210. The negative-z-facing surface of heat spreader 104 comprises a central area 212 in which master die 106 and decoupling capacitors 122 nest, and a peripheral area 214 that will, in the assembly process shown presently, be attached to the positive-z-facing surface of chip carrier 108.

The negative-z-facing surface of the chip carrier substrate 108 comprises an array of connection elements 211, such as gold-plated pads for use with a land-grid-array connector that connects the package 100 to a main circuit board (not shown). The thickness of chip carrier 108 must be large enough so that, after assembly, the negative-z-facing surface 216 of DRAM stack 110 does not protrude beyond the negative-z-facing surface of chip carrier 108.

Figure 2B:
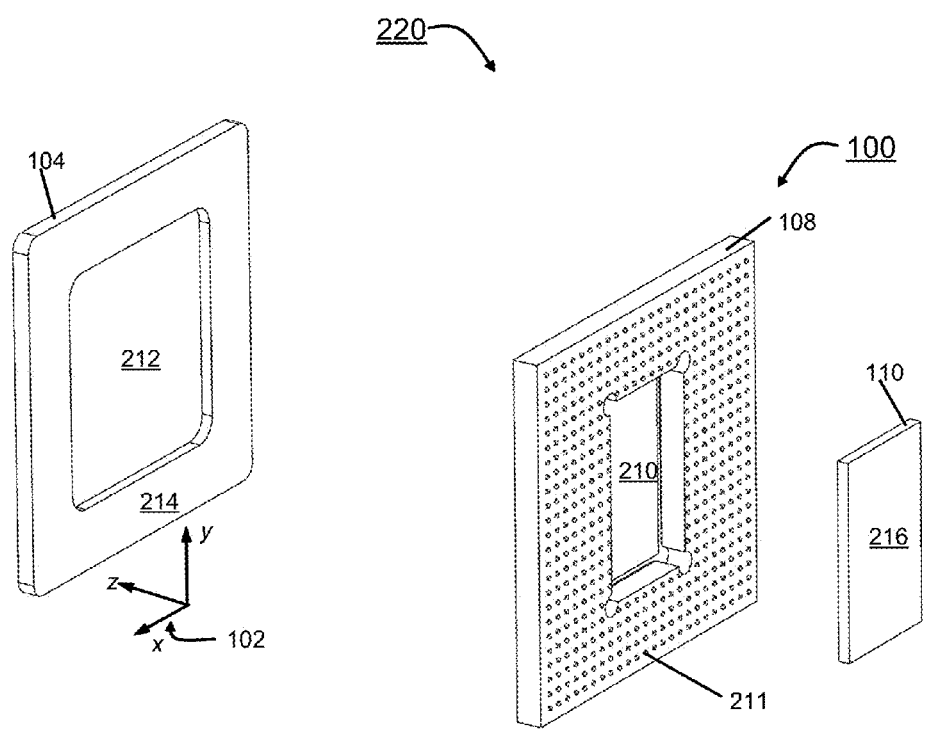

Referring now to FIG. 2B, a first step generally designated by the reference character 220 in the first assembly sequence of the 3D semiconductor stack 100 is shown. The first step 220 in the first assembly sequence is to solder-attach the master die 106 and the decoupling capacitors 122 to the chip carrier substrate 108. Specifically, the arrays 116, 118, 120, and 122 of connection elements on the positive-z-facing surface of chip carrier substrate 108 are solder-attached to the corresponding arrays 202, 204, 206, and 208 of connection elements on the negative-z-facing surface of master die 106.

Figure 2C:
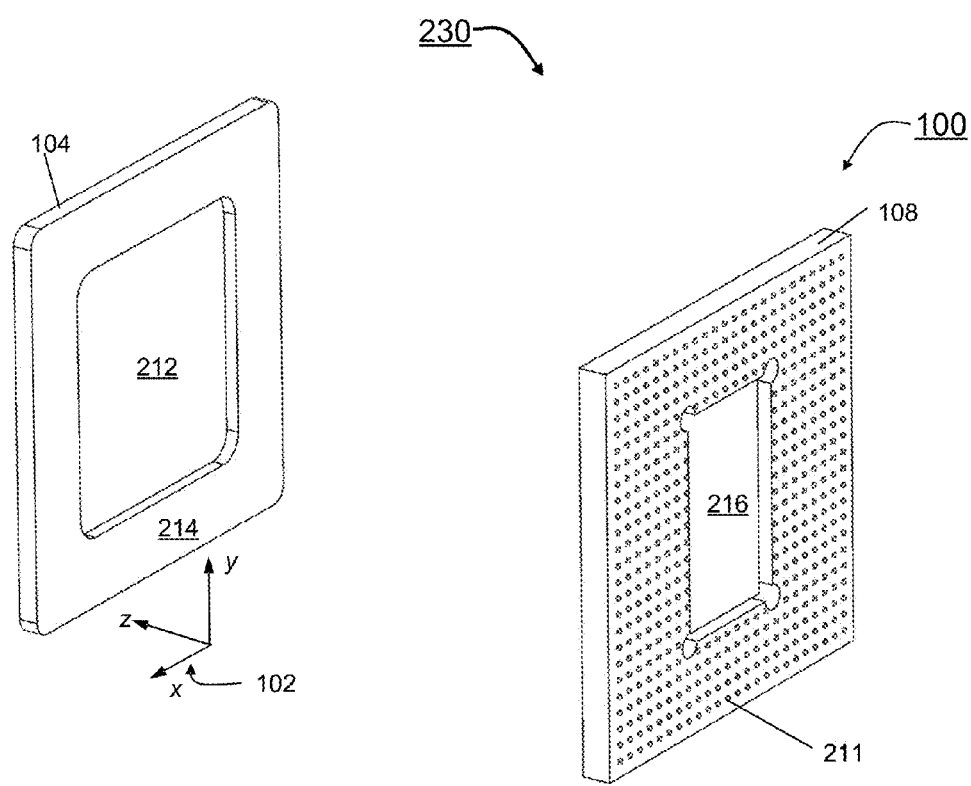

Referring now to FIG. 2C, a second step generally designated by the reference character 230 in the first assembly sequence of the 3D semiconductor stack 100 is shown. The second step 230 of the first assembly sequence is to solder-attach the DRAM stack 110 to the master die 106, as shown in FIG. 2C, with the array 126 of connection elements on the plus-z-facing surface of the DRAM stack 110 (see FIG. 1) being solder-attached to the array 211 of connections elements on the negative-z-facing surface of the master die 106.

Figure 2D:
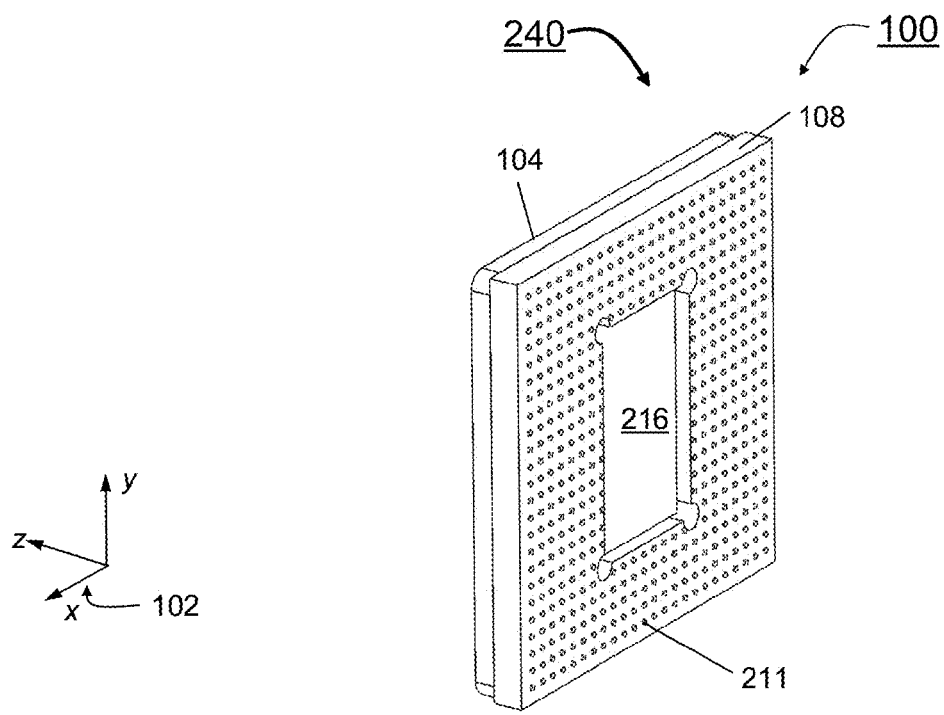

Referring now to FIG. 2D, there is shown a next or final step generally designated by the reference character 240 in the first assembly sequence of the 3D semiconductor stack 100. The final step 240 of the first assembly sequence is to attach the heat spreader 104 to the chip carrier 108, by conventional techniques well known in the art.

Referring to FIGS. 3A, 3B, 3C, and 3D, there is shown a second example assembly sequence for implementing the example enhanced three dimensional (3D) semiconductor stack of FIG. 1 in accordance with preferred embodiments. As compared to the first assembly sequence of FIGS. 2A, 2B, 2C, and 2D, the second assembly sequence reverses the order of the first and second steps.

Figure 3A:
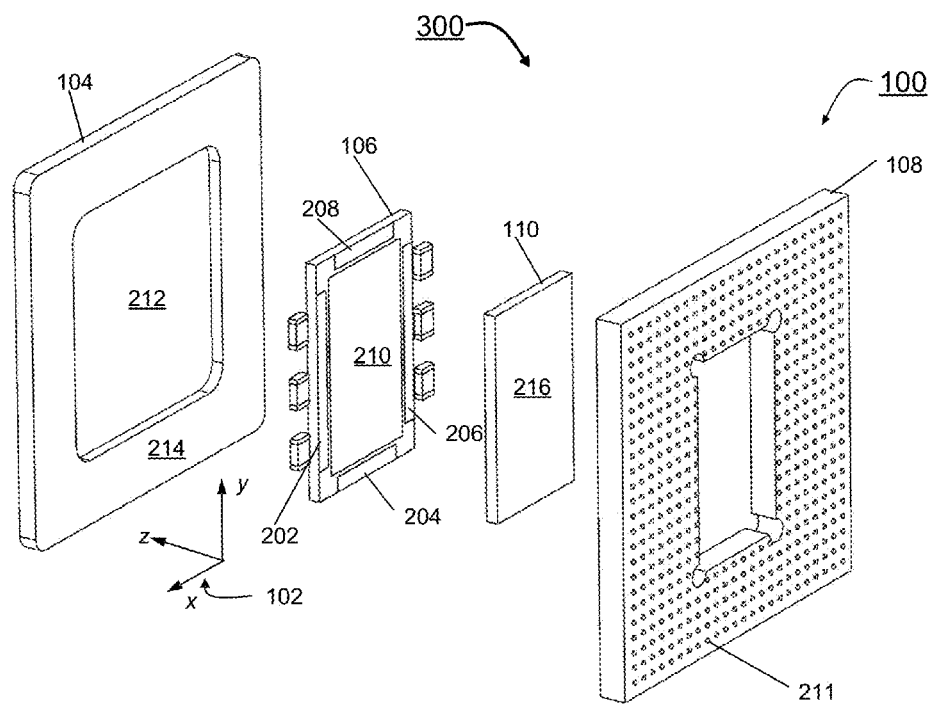
FIGS. 3A, 3B, 3C, and 3D show another example assembly sequence for implementing the example enhanced three dimensional (3D) semiconductor stack of FIG. 1 in accordance with preferred embodiments.

Referring now to FIG. 3A, the 3D semiconductor stack 100 is shown in an exploded view starting position generally designated by the reference character 300 for the example second assembly sequence.

Figure 3B:
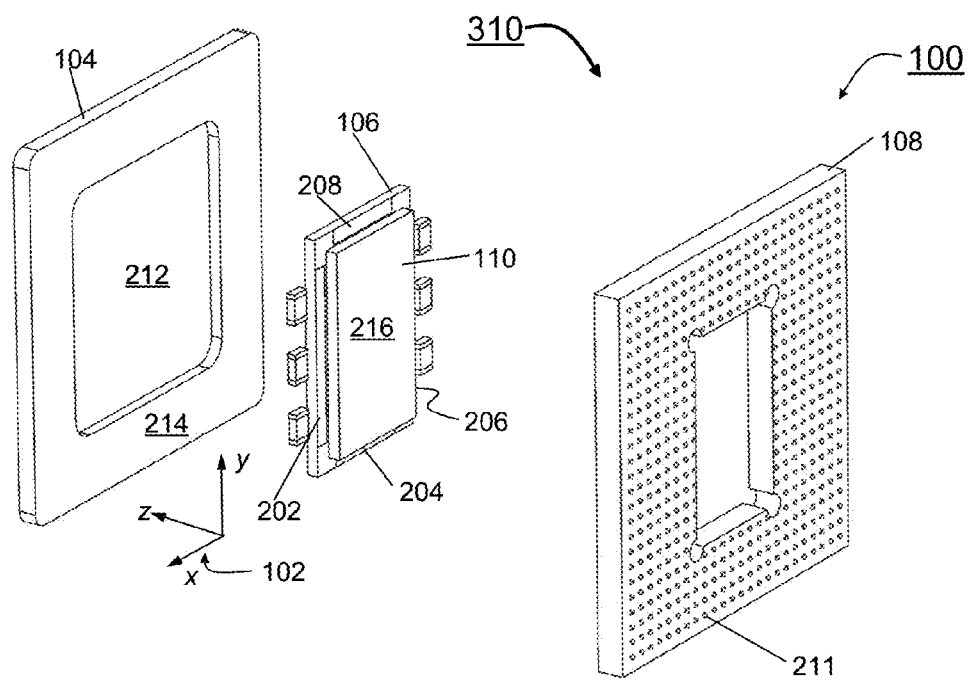

Referring now to FIG. 3B, there is shown a first step generally designated by the reference character 310 in the second assembly sequence of the 3D semiconductor stack 100. The first step 310 in the second assembly sequence is to solder-attach DRAM stack 110 to master die 106. Specifically, array 126 of connection elements on the plus-z-facing surface of DRAM stack 110 (see FIG. 1) is solder-attached to array 210 of connections elements on the negative-z-facing surface of the master die 106. This step 310 creates a master-die/DRAM assembly, as shown in FIG. 3B.

Figure 3C:
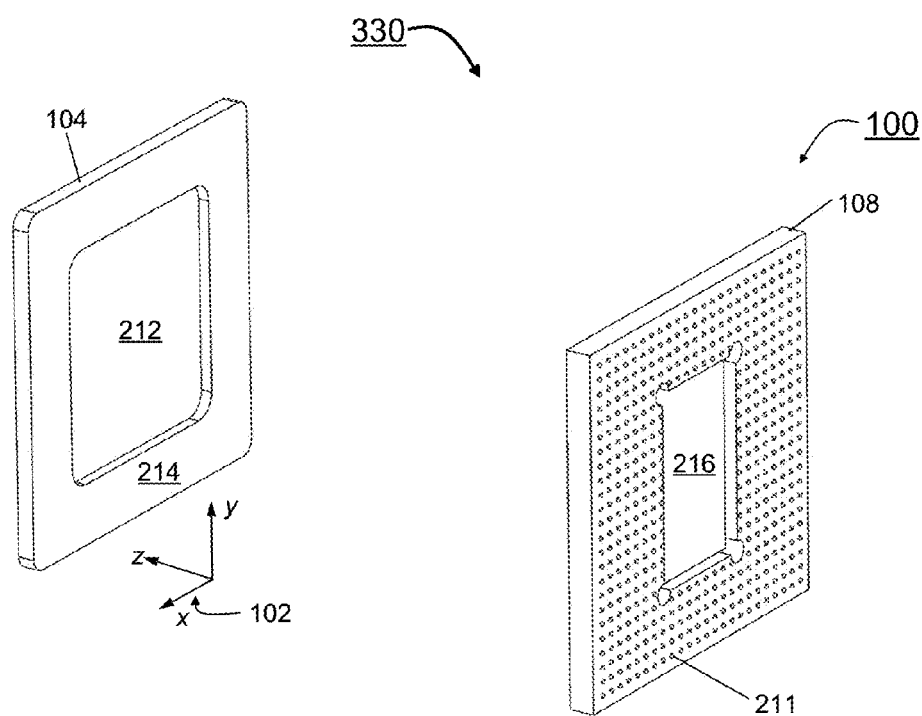

Referring now to FIG. 3C, there is shown a second step generally designated by the reference character 330 in the second assembly sequence of the 3D semiconductor stack 100. The second step in the second assembly sequence is to solder-attach the master-die/DRAM assembly to chip carrier 108. Specifically, arrays 116, 118, 120, and 122 of connection elements, located on the positive-z-facing surface of chip carrier 108, visible in FIG. 3B, are solder-attached to the corresponding arrays 202, 204, 206, and 208 of connection elements located on the negative-z-facing surface of master die 106.

Figure 3D:
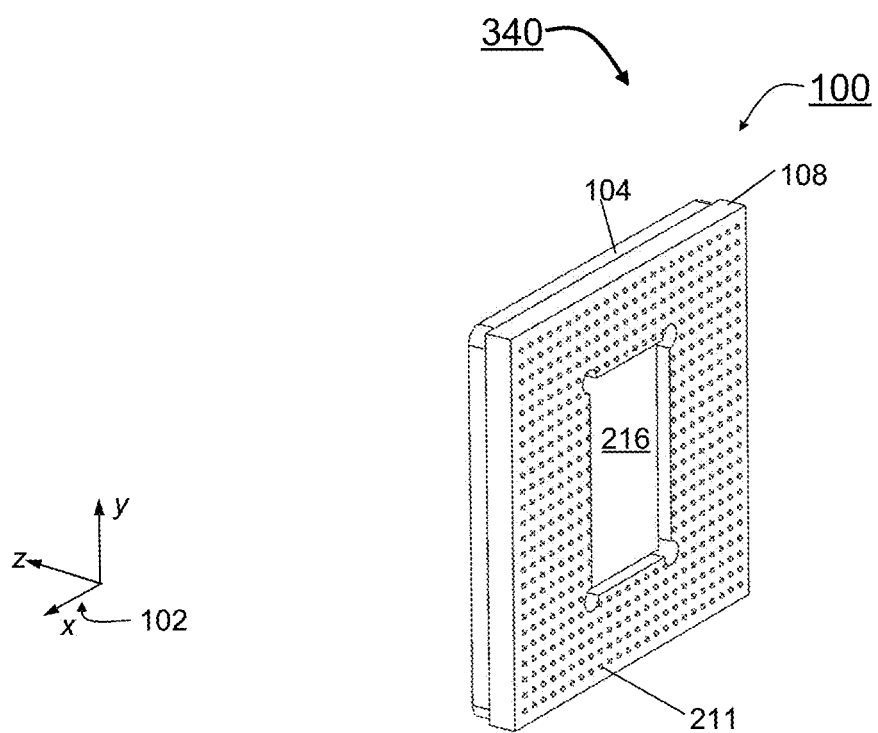

Referring now to FIG. 3D, there is shown a final step generally designated by the reference character 340 in the second assembly sequence of the 3D semiconductor stack 100. The final step 340 of the second assembly sequence is to attach heat spreader 104 to chip carrier 108, where the result is identical to that shown in FIG. 2D.

Figure 4:
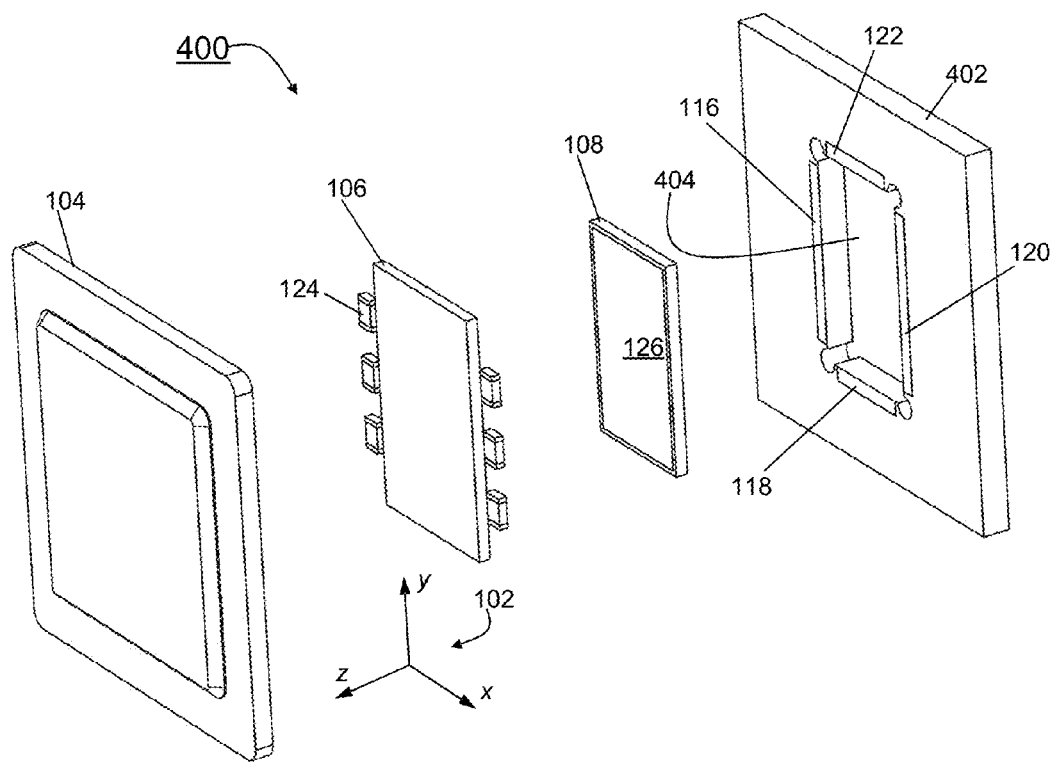
FIG. 4 is an exploded perspective view not to scale of example structures for implementing a second enhanced three dimensional (3D) semiconductor stack in accordance with preferred embodiments.

Referring now to FIG. 4, there is shown a second enhanced three dimensional (3D) semiconductor stack generally designated by the reference character 400 in accordance with preferred embodiments. In FIG. 4 and FIGS. 5A, 5B, 5C, 5D, and 5E the same reference numbers are used for substantially similar or identical components of the second enhanced 3D semiconductor stack 400 as compared to the enhanced 3D semiconductor stack 100.

As shown in FIG. 4, the second enhanced 3D semiconductor stack 400 as compared to the enhanced 3D semiconductor stack 100 includes a chip carrier 402 having a blind-hole cavity 404, instead of the chip carrier 108 having the through-hole 112. For example, the blind-hole cavity 404 is drilled, milled or reamed to a set depth without breaking through to the other side of chip carrier 402.

Referring also to FIGS. 5A, 5B, 5C, 5D, and 5E, a second example assembly sequence for implementing the example second enhanced three dimensional (3D) semiconductor stack 400 in accordance with preferred embodiments. Because the chip carrier 402 comprises blind hole 404 rather than through hole 112, the first assembly sequence described with respect to FIGS. 2A, 2B, 2C, and 2D for the first 3D semiconductor stack 100 is not possible for the second first 3D semiconductor stack 400.

Figure 5A:
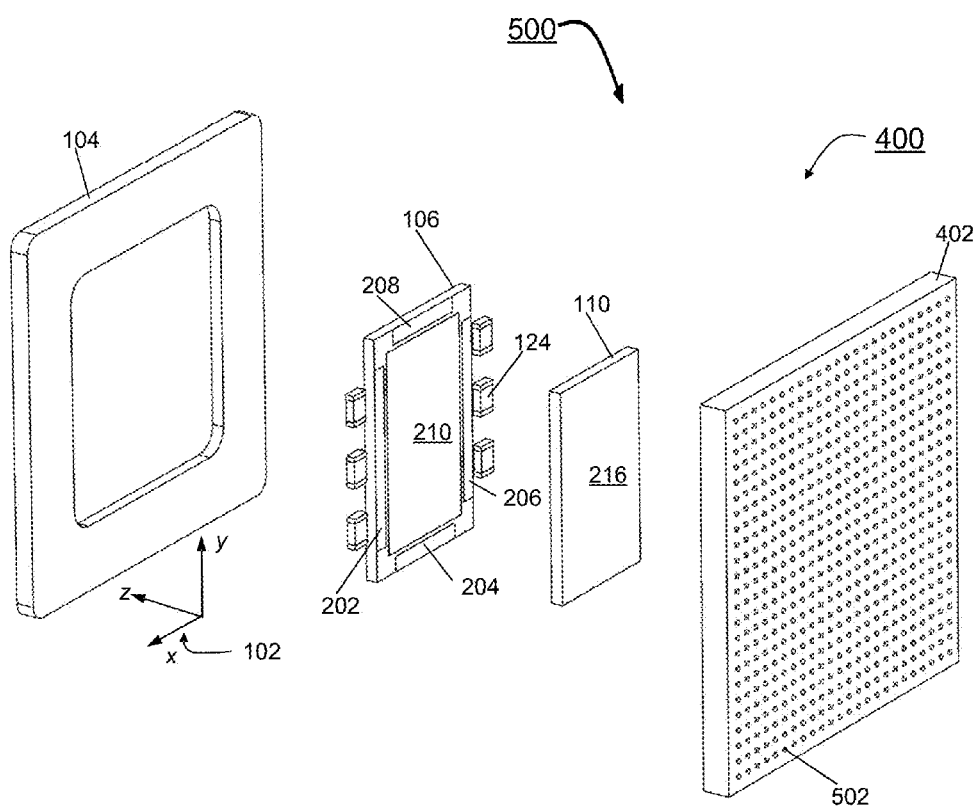
FIGS. 5A, 5B, 5C, 5D, and 5E show an example assembly sequence for implementing the example second enhanced three dimensional (3D) semiconductor stack of FIG. 4 in accordance with preferred embodiments.

Referring to FIG. 5A, the 3D semiconductor stack 400 is shown in an exploded view starting position generally designated by the reference character 500 for the example second assembly sequence. The negative-z-facing surface of substrate 402 advantageously, but optionally, is populated with a full rectangular array of connections elements 502, whereas the first 3D semiconductor stack 100 may be populated with only a partial array of connections elements 210, due to the presence of the through hole 112, for example as shown in FIG. 2A. All other components are identical in the 3D semiconductor stack 100 and the 3D semiconductor stack 400.

Figure 5B:
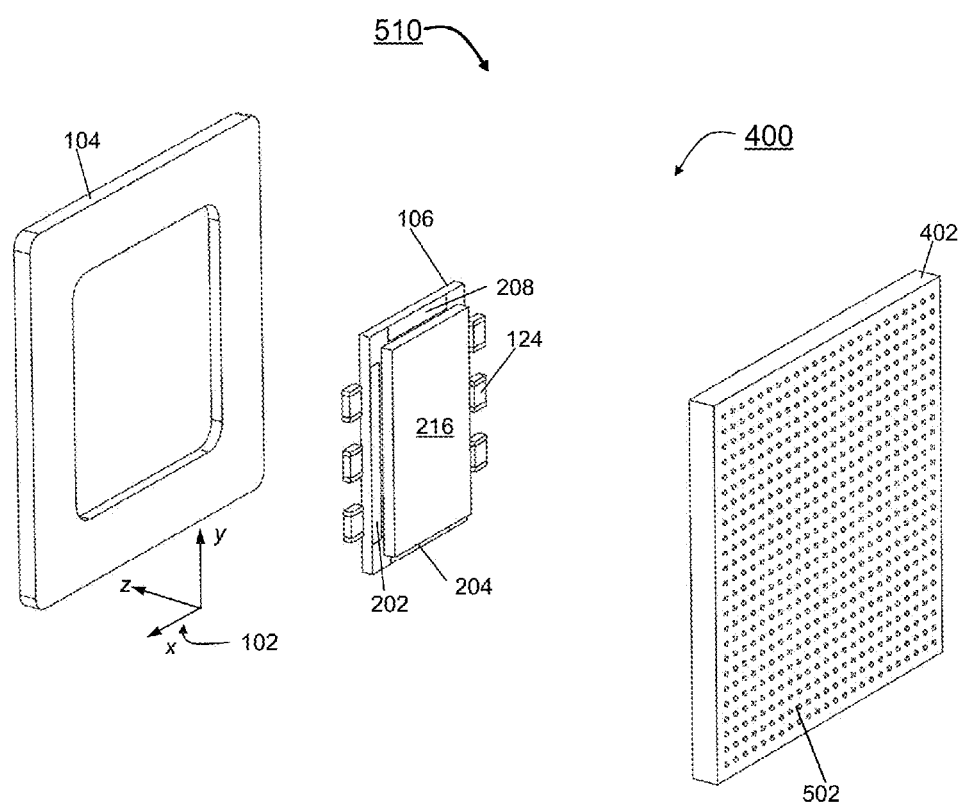
Figure 5C:
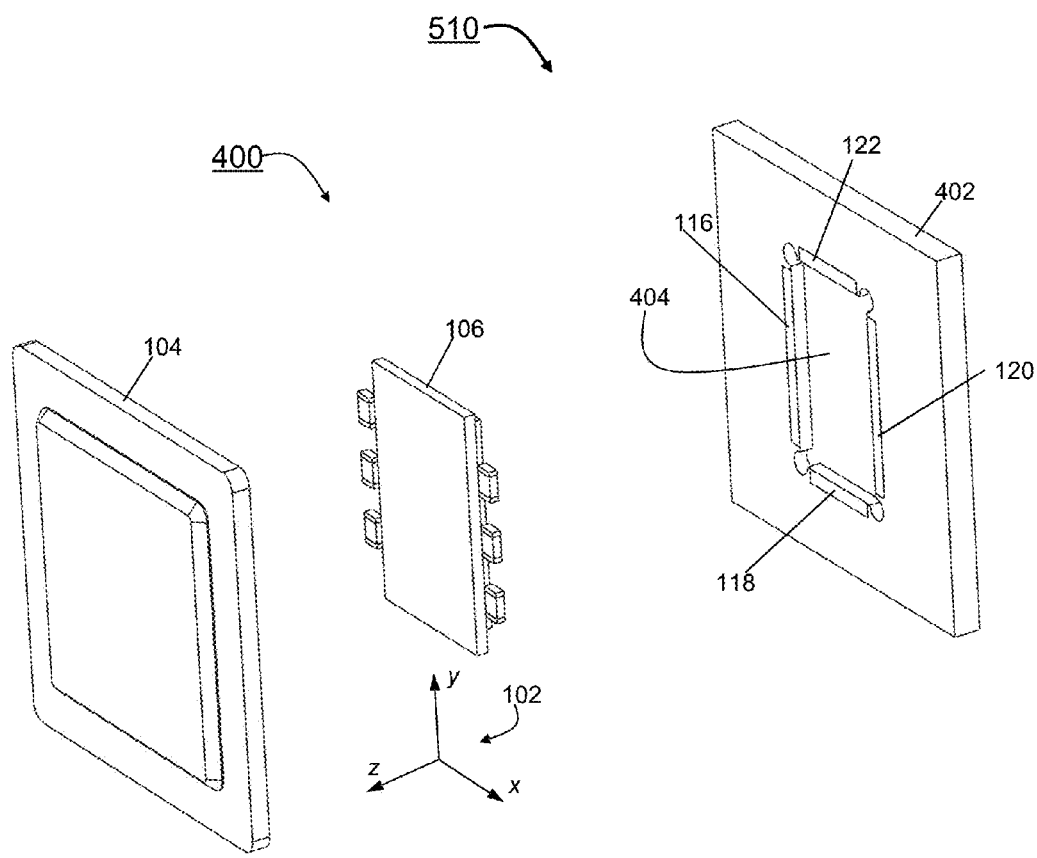

Referring now to FIGS. 5B and 5C, there are shown two perspective views of a first step in the second assembly sequence of the 3D semiconductor stack 100, the first step being generally designated by the reference character 510. The first step 510 in the second assembly sequence is to solder-attach the DRAM stack 110 to the master die 106. This step 510 creates a master-die/DRAM assembly, visible in FIG. 5B.

Figure 5D:
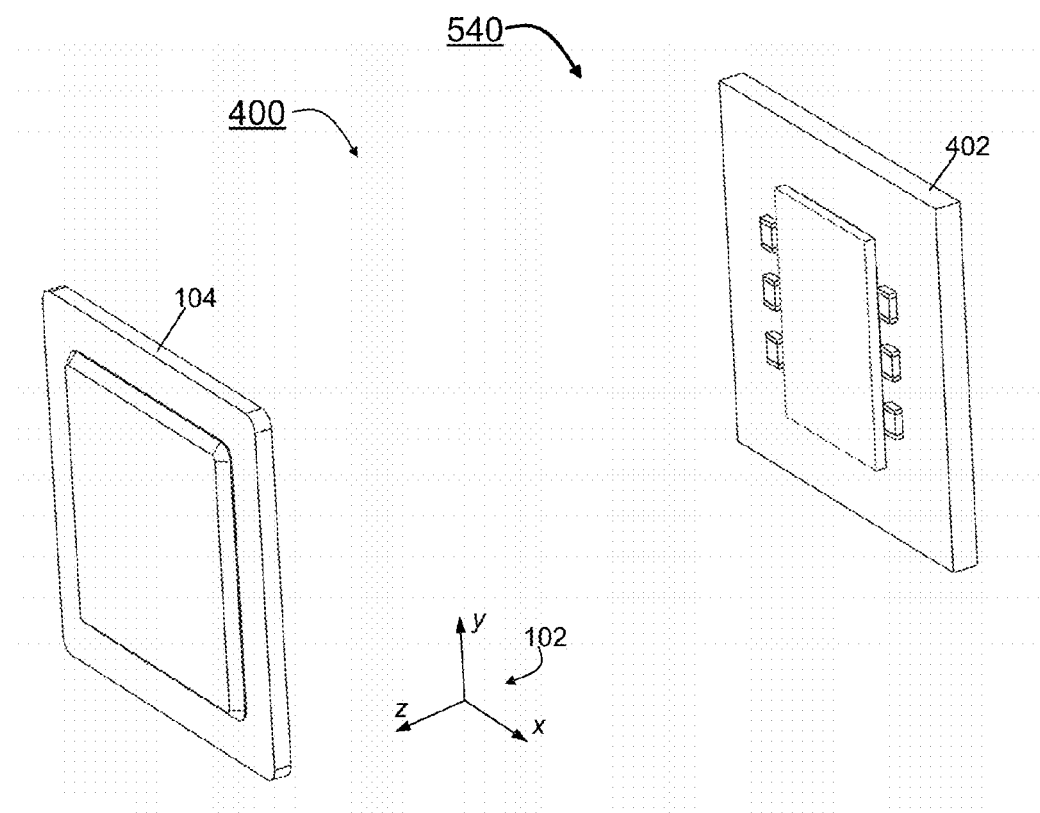

Referring now to FIG. 5D, there is shown a second step generally designated by the reference character 540 in the second assembly sequence of the 3D semiconductor stack 100. The second step 540 in the second assembly sequence is to solder-attach the master-die/DRAM assembly to chip carrier 402. Specifically, arrays 116, 118, 120, and 122 of connection elements on the positive-z-facing surface of chip carrier 402, visible in FIG. 5C, are solder-attached to the corresponding arrays 202, 204, 206, and 208 of connection elements on the negative-z-facing surface of master die 106, visible in FIG. 5B.

Figure 5E:
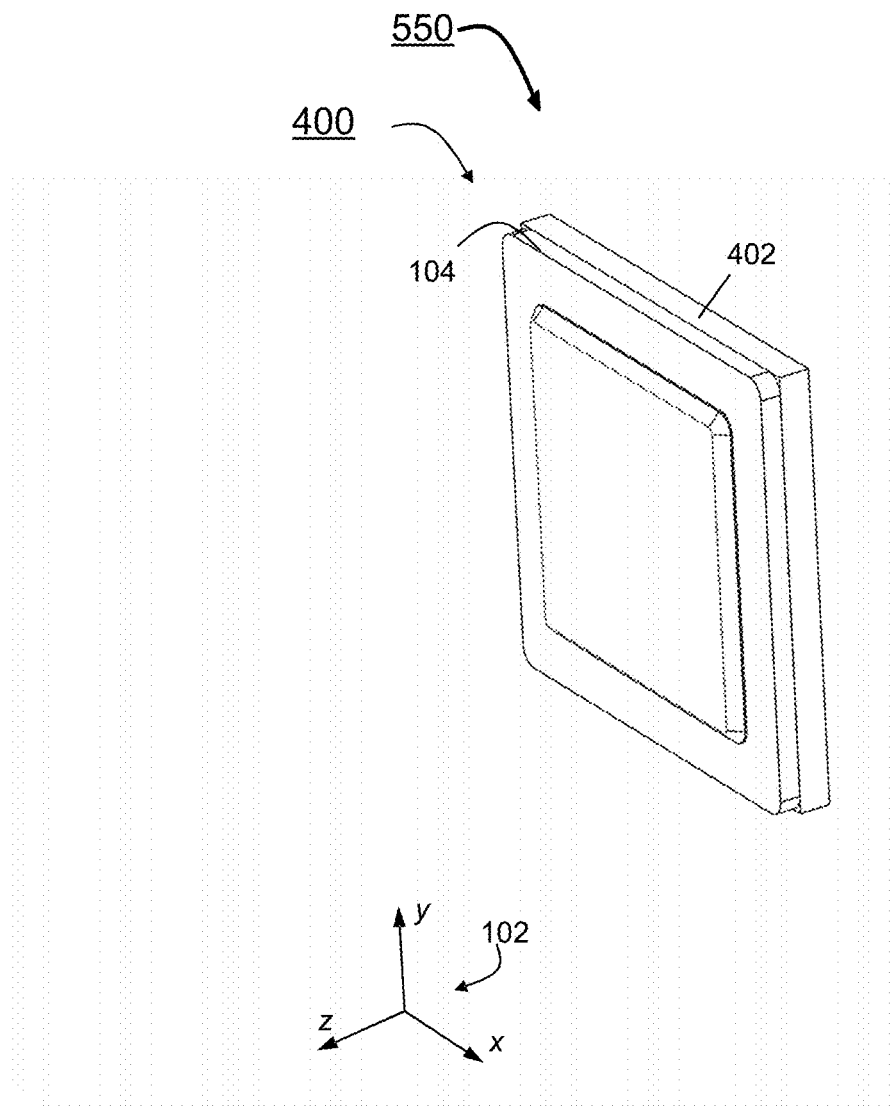

Referring now to FIG. 5E, there is shown a final step generally designated by the reference character 550 in the second assembly sequence of the 3D semiconductor stack 100. The final step 550 of the second assembly sequence is to attach heat spreader 104 to chip carrier 402.

Although the second 3D semiconductor stack 400 rules out the first assembly sequence, the 3D semiconductor stack 400 has two advantages over the first 3D semiconductor stack 100. First, blind hole 404 protects the rear surface of DRAM stack 106; and second, the full array 502 of connections elements in semiconductor stack 400 comprises a greater number of connections elements than the partial array 210 of connection elements in the 3D semiconductor stack 100. Such a large number of connection elements may be required to carry a large number of signals to and from the semiconductor stack 400. Consequently, if the second assembly sequence is viable, then the second 3D semiconductor stack 400 is preferred. However, if the second assembly sequence is not viable, then the first 3D semiconductor stack 100 is preferred.

In the first and second enhanced three dimensional (3D) semiconductor stack 100, 400, power enters the chip stack through the peripheral portion of the master die that overhangs the through-hole 112 or blind-hole 402. Consequently, power to DRAM stack 110 and any logic of master die 106 under DRAM stack 110 is fed horizontally, parallel to the plane of master die 106, which adds undesirable inductance and resistance to the wiring. The power-delivery problem has two potential solutions. The first solution makes use of so-called thick metal layers on master die 106. Although thick wiring layers are usually not employed on the DRAM layers, thick metal layers can be used on master die 106 for power distribution. Such thick metal layers are sufficient to deliver sufficient power to the interior of the stack 100, 400 to power both significant master die logic, as well as the DRAM stack 110. The second solution makes use of on-die voltage-regulation techniques, such as that used in IBM's Power7 processor. Such on-die voltage-regulation techniques create a very well-regulated voltage, offsetting the undesirable effects of the lateral wiring inductance and resistance.

Both the first enhanced 3D semiconductor stack 100 and the second enhanced 3D semiconductor stack 400 allow for the backside of master die 106 to be connected directly to heat spreader 104 or other cooling means, such that heat generated in the DRAM stack 110 travels through master die 106 to the cooling means. This cooling arrangement is preferred to the opposite situation in the prior art, where heat generated in the master die travels through the DRAM stack to the cooling means, because the master die generates more power than the DRAM stack. Consequently, thermal performance is better for the 3D semiconductor stack 100 and the 3D semiconductor stack 400, as illustrated by the thermal simulation illustrated in FIG. 6. Although DRAM temperature is slightly increased as compared to prior-art arrangements, the master-die temperature is dramatically reduced.

Figure 6:
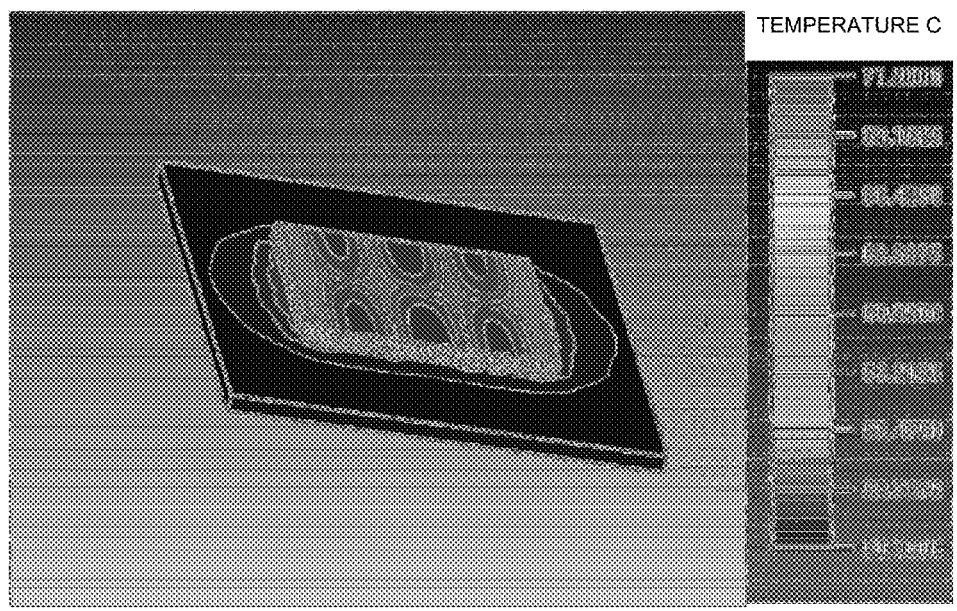
FIG. 6 illustrates a temperature distribution of example enhanced three dimensional (3D) semiconductor stacks in accordance with preferred embodiments.

Referring to FIG. 6 there is shown an example temperature distribution for the 3D semiconductor stack 100 and the 3D semiconductor stack 400 in accordance with preferred embodiments. Effective thermal performance is provided, as illustrated by the temperature distribution 600 for the 3D semiconductor stack 100 and the 3D semiconductor stack 400, providing improvement over the prior-art cooling arrangements.

While the present invention has been described with reference to the details of the embodiments of the invention shown in the drawing, these details are not intended to limit the scope of the invention as claimed in the appended claims.

What is claimed is:

1. A structure for implementing an enhanced three dimensional (3D) semiconductor stack comprising:
    a chip carrier having an aperture of a first length and first width;
    a first chip larger than said aperture and having a second length greater than the first length and a second width greater than the first width;
    a second chip smaller than said aperture and attached to said first chip, said second chip having a third length less than the first length and a third width less than the first width; said second chip extending into the aperture;
    said first chip attached to said chip carrier by connections in an overlap region defined by the first and second lengths and the first and second widths; said chip carrier providing power and carrying interface signals to said first chip in said overlap region eliminating need for through-silicon-vias;
    said first chip providing power and carrying interface signals to said second chip; and
    a heat spreader attached to said chip carrier and in thermal contact with said first chip for dissipating heat from both said first chip and said second chip.

2. The structure as recited in claim 1 wherein said aperture of said chip carrier includes a selected one of a through hole and a blind hole cavity.

3. The structure as recited in claim 1 wherein said first chip includes a master die of an inverted master-slave 3D semiconductor stack.

4. The structure as recited in claim 3 wherein said master die is a processor die being connected directly to a chip carrier.

5. The structure as recited in claim 4 wherein said second chip includes a slave dynamic random access memory (DRAM) stack and wherein said processor die connected to said chip carrier provides power and carries interface signals to said slave DRAM stack.

6. The structure as recited in claim 1 wherein said second chip extending into said aperture of said chip carrier includes a dynamic random access memory (DRAM) stack being attached directly to a master die implementing said first chip.

7. The structure as recited in claim 6 includes a thermal path between said master die and said DRAM stack, and said DRAM stack is effectively cooled through said master die.

8. The structure as recited in claim 1 wherein said chip carrier aperture includes a blind hole cavity.

9. The structure as recited in claim 8 wherein said first chip includes a master die and said second chip includes a dynamic random access memory (DRAM) stack attached directly to a master die before assembly with said chip arrier.

* * * * *